(12) United States Patent
Loiko et al.

(10) Patent No.: US 9,343,314 B2
(45) Date of Patent: May 17, 2016

(54) SPLIT GATE NANOCRYSTAL MEMORY INTEGRATION

(71) Applicants: Konstantin V. Loiko, Austin, TX (US); Brian A. Winstead, Bridgetown (CA)

(72) Inventors: Konstantin V. Loiko, Austin, TX (US); Brian A. Winstead, Bridgetown (CA)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/291,359

(22) Filed: May 30, 2014

(65) Prior Publication Data

US 2015/0348786 A1 Dec. 3, 2015

(51) Int. Cl.
| | |
|---|---|
| *H01L 21/28* | (2006.01) |
| *H01L 29/788* | (2006.01) |
| *H01L 27/115* | (2006.01) |
| *H01L 29/792* | (2006.01) |

(52) U.S. Cl.
CPC .... *H01L 21/28008* (2013.01); *H01L 21/28273* (2013.01); *H01L 27/11534* (2013.01); *H01L 29/7883* (2013.01); *H01L 21/28282* (2013.01); *H01L 27/11573* (2013.01); *H01L 29/792* (2013.01)

(58) Field of Classification Search
CPC .................. H01L 21/28008; H01L 21/28282; H01L 29/792; H01L 29/7883; H01L 27/11534; H01L 27/11573
USPC ........................................................ 438/591
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,130,168 A | 10/2000 | Chu et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |

(Continued)

FOREIGN PATENT DOCUMENTS

WO   2009058486   5/2009

OTHER PUBLICATIONS

U.S. Appl. No. 13/928,666, Hong, Office Action—Rejection, mailed Jul. 23, 2014.

(Continued)

*Primary Examiner* — Savitr Mulpuri (57) ABSTRACT

A method of making a split gate non-volatile memory (NVM) includes forming a charge storage layer on the substrate, depositing a first conductive layer, and depositing a capping layer. These layers are patterned to form a control gate stack. A second conductive layer is deposited over the substrate and is patterned to leave a first portion of the second conductive layer over a portion of the control gate stack and adjacent to a first side of the control gate stack. The first portion of the second conductive layer and the control gate stack are planarized to leave a dummy select gate from the first portion of the second conductive layer, where a top surface of a remaining portion of the first conductive layer is lower relative to a top surface of the dummy select gate. The dummy select gate is replaced with a select gate including metal.

13 Claims, 5 Drawing Sheets

(56) References Cited

U.S. PATENT DOCUMENTS

| | | | |
|---|---|---|---|
| 6,785,165 B2 | 8/2004 | Kawahara et al. |
| 6,861,698 B2 | 3/2005 | Wang |
| 6,939,767 B2 | 9/2005 | Hoefler et al. |
| 7,154,779 B2 | 12/2006 | Mokhlesi et al. |
| 7,183,159 B2 | 2/2007 | Rao et al. |
| 7,190,022 B2 | 3/2007 | Shum et al. |
| 7,202,524 B2 | 4/2007 | Kim et al. |
| 7,208,793 B2 | 4/2007 | Bhattacharyya |
| 7,223,650 B2 | 5/2007 | Chang |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,745,344 B2 | 6/2010 | Chindalore |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,003,482 B2 * | 8/2011 | Brown ............... G03F 9/708 257/E21.214 |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,173,505 B2 | 5/2012 | Herrick et al. |
| 8,216,947 B2 * | 7/2012 | Lee ............... H01L 21/0332 438/267 |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 * | 9/2013 | Hall ............... H01L 29/66833 257/E21.662 |
| 8,536,006 B2 | 9/2013 | Shroff et al. |
| 8,536,007 B2 * | 9/2013 | Hall ............... H01L 29/66833 257/E21.662 |
| 8,679,927 B2 | 3/2014 | Ramkumar et al. |
| 8,871,598 B1 | 10/2014 | Perera |
| 8,937,011 B2 * | 1/2015 | Iuchi ............... H01L 21/76837 257/E21.585 |
| 8,969,206 B1 * | 3/2015 | Sel ............... H01L 21/32139 216/46 |
| 9,112,056 B1 * | 8/2015 | Shroff ............... H01L 21/8239 |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0188753 A1 | 9/2004 | Kawashima et al. |
| 2004/0262670 A1 | 12/2004 | Takebuchi et al. |
| 2005/0145949 A1 | 7/2005 | Sadra et al. |
| 2005/0247962 A1 | 11/2005 | Bhattacharyya |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0263749 A1 * | 10/2009 | Sim ............... H01L 21/0337 430/319 |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2010/0096719 A1 * | 4/2010 | Lee ............... H01L 21/0332 257/506 |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |
| 2014/0227843 A1 | 8/2014 | Tsukamoto et al. |

OTHER PUBLICATIONS

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

(56) References Cited

OTHER PUBLICATIONS

U.S. Appl. No. 13/661,157, Office Action—Restriction, mailed Oct. 2, 2014.
U.S. Appl. No. 14/041,662, Perera, Office Action—Allowance, mailed Oct. 17, 2014.
Notice of Allowance mailed Mar. 6, 2014 for U.S. Appl. No. 13/491,771, 3 pages.
Notice of Allowance mailed Jan. 22, 2015 for U.S. Appl. No. 13/790,004, 11 pages.
Office Action mailed Feb. 12, 2015 for U.S. Appl. No. 13/971,987, 7 pages.
Office Action mailed Dec. 4, 2014 for U.S. Appl. No. 13/972,372, 5 pages.
Office Action mailed Dec. 5, 2014 for U.S. Appl. No. 13/962,338, 7 pages.
Office Action mailed Dec. 5, 2014 for U.S. Appl. No. 13/971,987, 5 pages.
Notice of Allowance mailed Mar. 30, 2015 for U.S. Appl. No. 13/790,004, 5 pages.
Notice of Allowance mailed Apr. 27, 2015 for U.S. Appl. No. 13/971,987, 12 pages.
First Action Interview Office Action mailed May 22, 105 for U.S. Appl. No. 13/972,372, 12 pages.
Notice of Allowance mailed May 13, 2014 for U.S. Appl. No. 13/962,338, 11 pages.
U.S. Appl. No. 13/491,771, Office Action mailed Mar. 6, 2014.
Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO—SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Office Action—Allowance—May 3, 2013.
U.S. Appl. No. 13/789,971, Office Action—Allowance—May 15, 2013.
U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A.H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.

(56) References Cited

OTHER PUBLICATIONS

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/781,727, Office Action—Restriction, Jun. 21, 2013.
U.S. Appl. No. 13/780,591, Office Action—Allowance, Nov. 22, 2013.
U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.
U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013.
U.S. Appl. No. 14/195,299, Shroff, M., et al., "Method of Making a Logic Transistor and a Non-Volatile Memory (NVM) Cell", filed Mar. 3, 2014.
U.S. Appl. No. 14/228,672, Hall, M.D., et al., "Method of Forming a Split-Gate Device", filed Mar. 28, 2014.
U.S. Appl. No. 14/228,678, Hall, M.D., et al., "Method of Forming a Split-Gate Device", filed Mar. 28, 2014.
U.S. Appl. No. 14/228,682, Shroff, M., et al., "Method of Forming a Split-Gate Device", filed Mar. 28, 2014.
U.S. Appl. No. 13/441,426, Shroff, M. D., et al., Office Action—Allowance, mailed Jun. 9, 2014.
Notice of Allowance mailed Aug. 4, 2015 for U.S. Appl. No. 13/972,372, 8 pages.
Restriction Requirement mailed Jul. 27, 2015 for U.S. Appl. No. 13/973,433, 7 pages.
Notice of Allowance mailed Sep. 29, 2015 for U.S. Appl. No. 13/972,372, 9 pages.
Notice of Allowance mailed Nov. 4, 2015 for U.S. Appl. No. 13/973,433, 10 pages.

* cited by examiner

SPLIT GATE NANOCRYSTAL MEMORY INTEGRATION

BACKGROUND

1. Field

This disclosure relates generally to integrated circuit devices and methods for manufacturing same, and more specifically, to the fabrication of CMOS metal gate devices and non-volatile memory devices integrated on a single substrate or chip.

2. Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. While the introduction of novel gate stack materials for forming high-k metal gate stacks using "metal gate-last" processes has improved device performance and reduced feature sizes for transistor devices, there are a number of integration options and challenges associated with the integration of such novel materials with existing polysilicon nanocrystal thin film storage bitcells.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Overview

The following sets forth a detailed description of various embodiments intended to be illustrative of the invention and should not be taken to be limiting.

A compact split gate nanocrystal thin film storage (TFS) non-volatile memory (NVM) bitcell integrated with metal gate transistors, such as high-k dielectric metal gate (HKMG) transistors, and associated fabrication process are disclosed in which the NVM bitcells are formed with a non-metal (e.g., polysilicon or non-HKMG material) control gate that is formed along with a metal select gate (e.g., HKMG) using a CMOS metal gate-last fabrication sequence to enable the co-existence of embedded flash and metal transistors on the same wafer. In selected embodiments, non-metal control gate structures are first formed on the substrate, and then dummy select gate structures and dummy logic gate structures are formed on the substrate. A top surface of the non-metal control gate structure is coplanar with or lower relative to the top surfaces of the dummy select gate structures, as well as lower relative to the top surfaces of the dummy logic gate structures. The dummy select gate structures are replaced with metal (e.g., HKMG) select gates, and the dummy logic gate structures are replaced with metal (e.g., HKMG) logic gates.

In this disclosure, an improved system, apparatus, and "control gate-first" fabrication method are described for fabricating embedded non-volatile memory devices on-chip with CMOS metal gate transistors using a metal gate-last process that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form metal gate stacks, such as high-k metal gate (HKMG) stacks. With some existing HKMG fabrication processes, there are challenges with integrating a split gate TFS bitcell into a metal gate-last technology that is used to form metal gate stacks. Various illustrative embodiments of the present invention will now be described in detail with reference to the accompanying figures.

While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Example Embodiments

Figure 1:
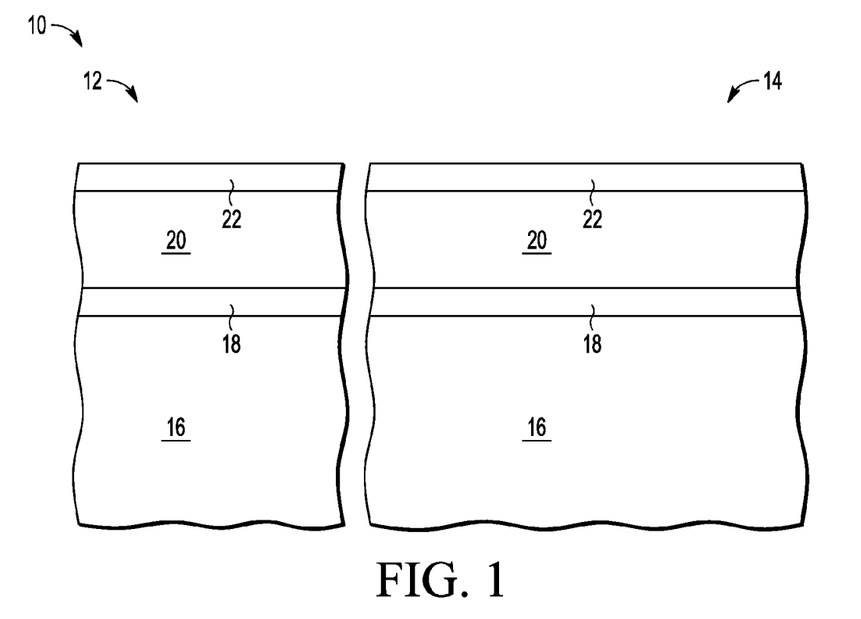
FIG. 1-9 illustrate an example semiconductor device during successive phases of a fabrication process that implements the present disclosure, according to some embodiments.

FIG. 1 is a partial cross-sectional view of a first example semiconductor device or structure 10 formed on a semiconductor substrate 16, which includes a logic region 12 and a non-volatile memory (NVM) region 14. Logic region 12 includes an area in which logic devices (e.g., CMOS, PMOS, NMOS transistors) are generally formed. NVM region 14 includes an area in which non-volatile memory devices (e.g., NVM bitcells) are generally formed. Though various structures and layer regions are illustrated throughout the figures with straight lines and curved or corner regions, it will be appreciated that the actual profile(s) for the different structures and layer regions will not necessarily conform to simplified depictions, but will instead depend on the specific fabrication process(es) used. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). The semiconductor substrate described herein can be any semiconductor material or combinations of materials, such as gallium arsenide, silicon germanium, silicon-on-insulator (SOI), silicon, monocrystalline silicon, the like, and combinations of the above.

As described below, one or more split gate thin film storage non-volatile memory bitcells may be formed in NVM region 14 with one or more polysilicon control gates and one or more metal select gates using any desired processing steps. A non-limiting example of processing steps that may be used is provided herein. In the semiconductor structure 10, a charge storage layer 18 is formed over substrate 16 (e.g., deposited over the entirety of the substrate). Charge storage layer 18 includes discrete storage elements, such as silicon nanocrystals. In other embodiments, the discrete storage elements are made of other types of materials, such as, for example, polysilicon nanocrystals, silicon germanium nanocrystals, nanoclusters of a metal (e.g. gold, ruthenium, nickel, cobalt, tungsten), or nanoclusters of a silicide (e.g. cobalt silicide, nickel silicide). The discrete storage elements are used to selectively store charge introduced during a programming operation to selectively adjust a voltage threshold of a transistor depending upon whether a "1" or "0" value is to be stored in the memory cell. In selected embodiments, the charge storage layer 105 is formed as a nanocrystal stack, thereby forming a polysilicon-nitrided-silicon dioxide (poly-SiON) stack. While any desired charge storage layer sequence may be used, in selected example embodiments, the charge storage layer 105 may include an insulating layer formed over the substrate 16, such as by depositing a high-k dielectric layer or other appropriate insulating layer to a predetermined thickness (e.g., approximately 40-150 Angstroms), though other thicknesses may be used. On the insulating layer, a layer of conductive nanocrystals may be formed, where the nanocrystals having predetermined diameters (e.g., approximately 3-10 nanometers) and spacing (e.g., about 5 nanometers apart). After depositing the nanocrystals, another insulating layer is formed over and around the nanocrystals, such as by depositing a suitable high-k dielectric with a low pressure chemical vapor deposition (LPCVD) to a predetermined thickness (e.g., approximately 100-200 Angstroms), though other materials or thicknesses may be used.

Subsequently, a first poly layer 20 (also referred to as a first conductive layer) is formed over charge storage layer 18 (e.g., deposited over the entirety of the substrate), such as by blanket-deposition of a conformal layer of polysilicon using chemical vapor deposition (CVD), plasma-enhanced chemical vapor deposition (PECVD), physical vapor deposition (PVD), atomic layer deposition (ALD), or any combination(s) thereof to a thickness of approximately 500-2000 Angstroms, although a thinner or thicker layer may also be used. Poly layer 20 may be deposited as a doped poly layer, or may be subsequently doped with appropriate impurities to make poly layer 20 conductive. It is noted that poly layer 20 is thinner than a traditional control gate poly layer. Subsequently, a capping layer 22 is formed over poly layer 20 (e.g., deposited over the entirety of the substrate). Capping layer 22 may be an anti-reflective coating (ARC) material, such as silicon nitride.

Figure 2:
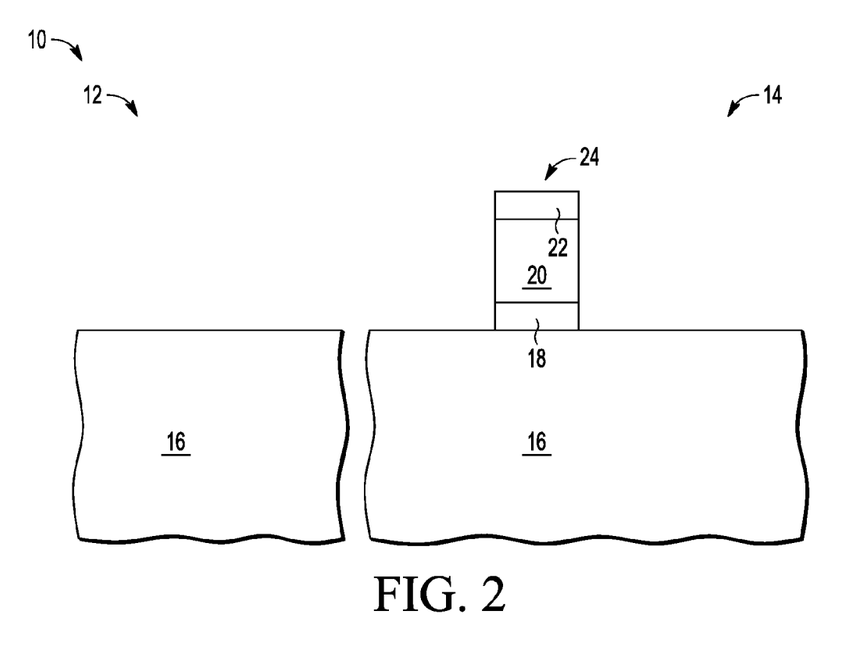

FIG. 2 illustrates processing of semiconductor structure 10 subsequent to FIG. 1. Charge storage layer 18, poly layer 20, and capping layer 22 are patterned and etched to form one or more control gate stacks 24 in NVM region 14. Each control gate stack 24 includes a remaining portion of charge storage layer 18, a remaining portion of poly layer 20 (also referred to as a polysilicon control gate), and a remaining portion of capping layer 22. As will be appreciated, any desired gate patterning and etch sequence may be used to form the one or more control gate stacks 24, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. In one example (not shown), a patterned etch mask is formed over the intended control gate region(s) in NVM region 14 by patterning a photoresist layer or other hard mask layer. The exposed regions not covered by the patterned etch mask are then selectively etched with a dry etch, such as a reactive ion etch process, and removed. Any remaining etch mask or photoresist layers are then stripped or removed.

Figure 3:
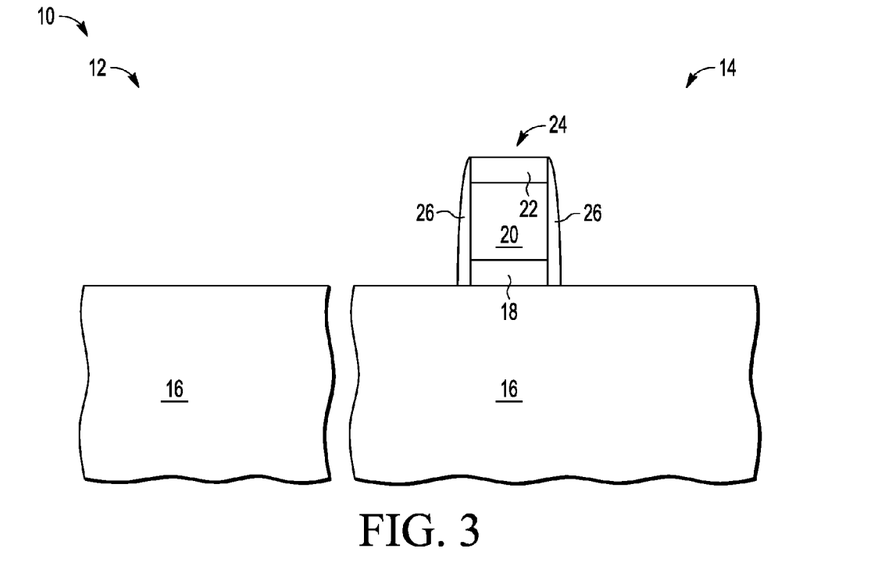

FIG. 3 illustrates processing of semiconductor structure 10 subsequent to FIG. 2. A first set of sidewall spacers 26 are formed around control gate stack 24 in NVM region 24. For example, one or more dielectric layers (e.g., silicon dioxide or nitride) are formed over the substrate including over the one or more control gate stacks 24 (e.g., deposited over the entirety of the substrate) and are anisotropically etched to form sidewall spacers 26.

Figure 4:
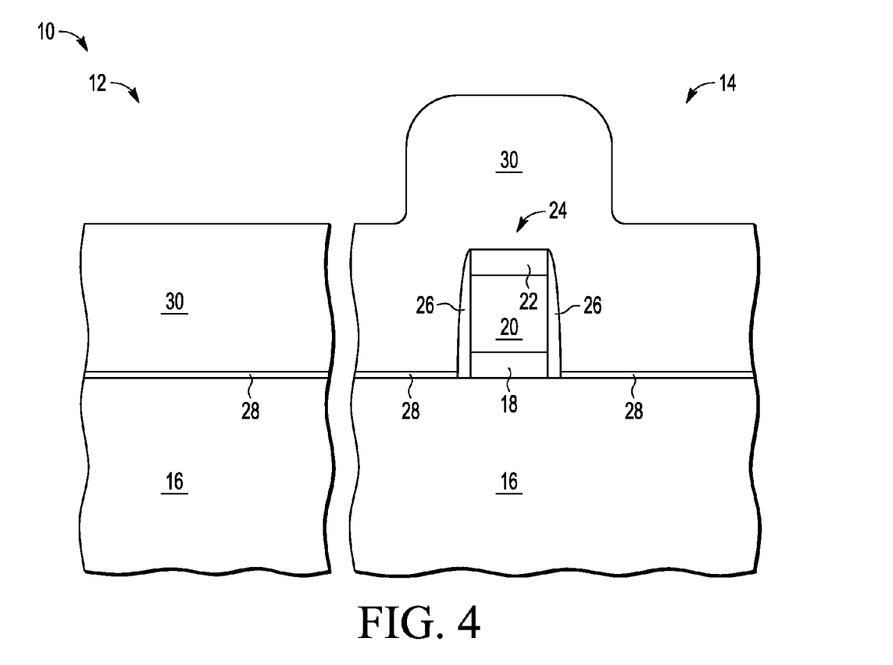

FIG. 4 illustrates processing of semiconductor structure 10 subsequent to FIG. 3. A gate dielectric layer 28 is formed over substrate 16. Though the gate dielectric layer 28 is shown having a same thickness in logic region 12 and NVM region 14 for purposes of simplicity, gate dielectric layer 28 may have different thicknesses or constituent materials. Gate dielectric layer 28 includes one or more layers of gate dielectric materials. In some embodiments, gate dielectric layer 28 is formed by thermally growing an oxide layer on substrate 16 (also referred to as a thermal oxide layer) or depositing an oxide layer with a low pressure chemical vapor deposition (LPCVD) high temperature oxide (HTO) over substrate 16, including over control gate stack 24 (not shown). Such an oxide layer has a predetermined thickness (e.g., approximately 5-50 Angstroms), depending on the gate dielectric requirements of the devices formed in logic region 12 and NVM region 14. In other embodiments, gate dielectric layer 28 includes a high-k dielectric layer, which is formed alone or in combination with a deposited barrier metal layer, including over control gate stack 24 (not shown). High-k dielectric and barrier layers are further discussed below in connection with FIG. 9.

A second poly layer 30 (also referred to as a second conductive layer) is formed over gate dielectric layer 28 and over control gate stack 24 (e.g., deposited over the entirety of the substrate), such as by blanket-deposition of a conformal layer of polysilicon using CVD, PECVD, PVD, ALD, or any combination(s) thereof to a thickness of approximately 500-2000 Angstroms, although a thinner or thicker layer may also be used. Poly layer 30 serves as a dummy gate material that will be replaced with metal, as further described below. Poly layer 30 may be deposited as a doped poly layer, or may be subsequently doped with appropriate impurities to make poly layer 30 conductive. The second poly layer 30 formed over the control gate stack has a greater height (or thickness) relative to the height of the control gate stack in the NVM region.

Figure 5:
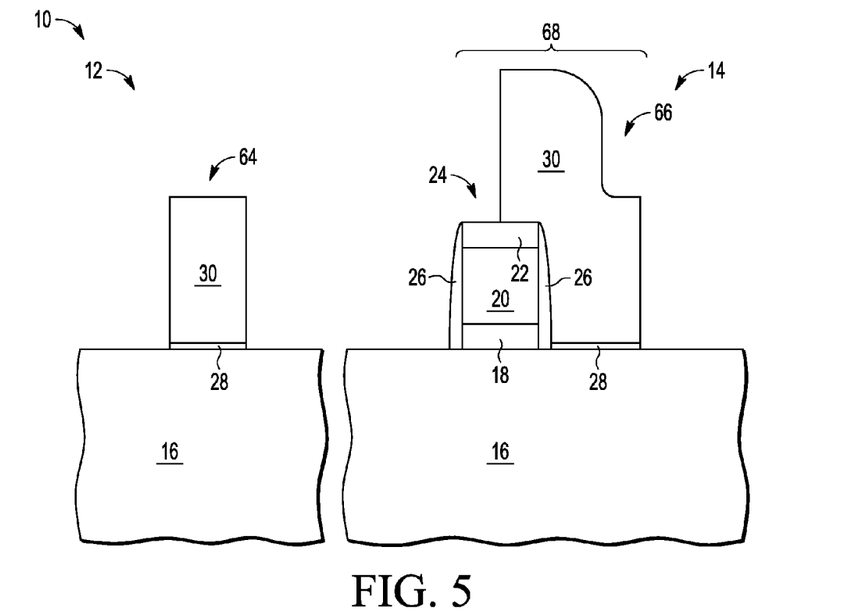

FIG. 5 illustrates processing of semiconductor structure 10 subsequent to FIG. 4. Poly layer 30 and gate dielectric layer 28 are patterned and etched to form one or more logic gate structures 64 in logic region 12 and one or more select gate structures 66 in NVM region 14. Logic gate structure 64 includes a first remaining portion of poly layer 30 (or dummy gate material) and a select gate structure 66 includes a second remaining portion of poly layer 30 (or dummy gate material). The second remaining portion of poly layer 30 is selectively formed adjacent to control gate stack 24 to cover at least a first side of the control gate stack 24 and an adjacent region of the substrate 16 (e.g., over an adjacent control channel region in the substrate 16). The select gate structure 66 and control gate stack 24 together form a split gate structure 68. It is noted that in the event the gate dielectric layer 28 is deposited over the select gate stack 24, the gate dielectric layer 28 is removed from the control gate stack's outer sidewall spacer 26 (which is the sidewall spacer that is not between the control gate stack 24 and the select gate structure 66).

As will be appreciated, any desired gate patterning and etch sequence may be used to form the one or more logic gate structures 64 and one or more select gate structures 66, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. In one example (not shown), a patterned etch mask is formed over the intended logic and select gate region(s) by patterning a photoresist layer or other hard mask layer. The exposed regions not covered by the patterned etch mask are then selectively etched with a dry etch, such as a reactive ion etch process, and removed. Any remaining etch mask or photoresist layers are then stripped or removed.

Figure 6:
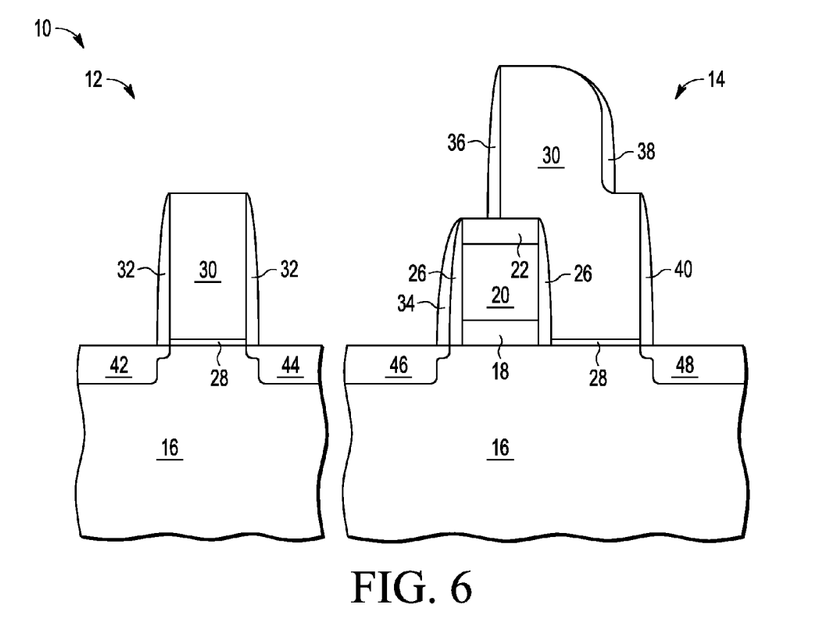

FIG. 6 illustrates processing of semiconductor structure 10 subsequent to FIG. 5. A second set of sidewall spacers 32 are formed around the logic gate structure 64 in logic region 12, and a third set of sidewall spacers 34, 36, 38, and 40 are formed around the split gate structure 68 in NVM region 14. For example, one or more dielectric layers (e.g., silicon dioxide or nitride) are formed over the substrate including over the one or more logic gate structures and over the one or more split gate structures (e.g., deposited over the entirety of the substrate) and are anisotropically etched to form sidewall spacers.

One or more source/drain implant regions 42, 44, 46, and 48 are also formed in substrate 16, such as by implanting impurities around the split gate structure 68 in NVM region 14, the logic gate structure 64 in logic region 12, any sidewall spacers, and any implant masks (not shown) formed over substrate 16. Source/drain regions 42 and 44 are formed adjacent to the sides of the logic gate structure 64 in logic region 12. Source/drain region 46 is formed adjacent to sidewall 26 of the control gate stack 24 and source/drain region 48 is formed adjacent to a side of the select gate structure 66 in NVM region 14. The one or more source/drain implant regions may be formed using any desired source/drain implant process for implanting ions having a predetermined conductivity type. For example, the logic gate structures and split gate structures in combination with one or more patterned implant masks (not shown) may be used to form halo or extension regions (not shown) by implanting appropriate polarity dopants, such as n-type halo/extension regions for n-type flash cell devices or p-type halo/extension regions for p-type flash cell devices around the logic and control/select gate stacks and into the substrate 16. Though not shown, silicided regions may be formed on one or more of the source/drain regions 42, 44, 46, and 48, if not also on a top surface of the logic gate structure 64, select gate structure 68, and control gate stack 24, such as by forming self-aligned silicide regions by depositing and thermally annealing conductive or metal layer (e.g., cobalt or nickel) to react with the exposed semiconductor layers to form the silicide regions.

Figure 7:
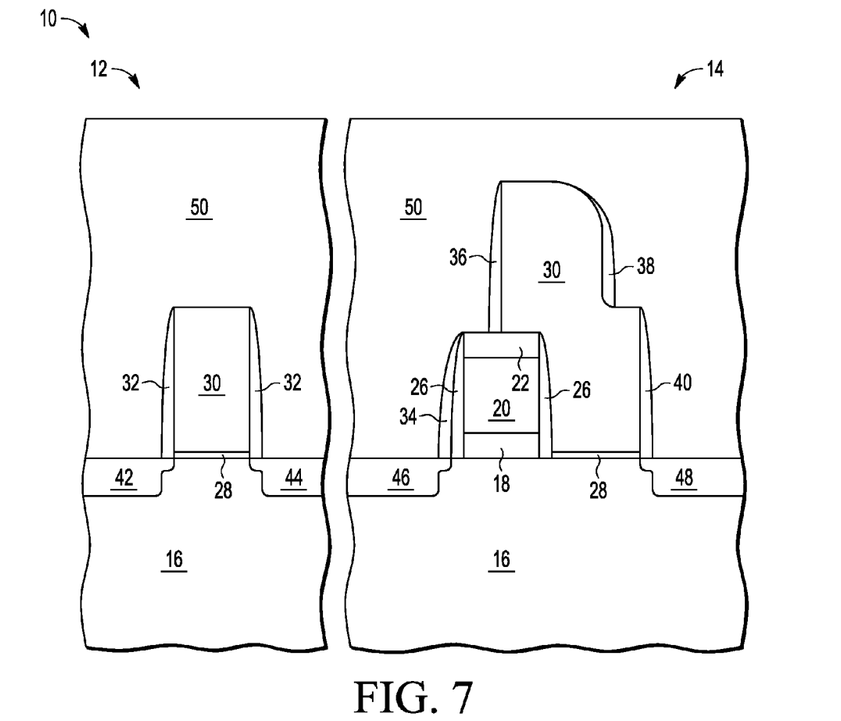

FIG. 7 illustrates processing of semiconductor structure 10 subsequent to FIG. 6. An interlayer dielectric (ILD) layer 50 (e.g., silicon oxide) is formed over substrate 16 (e.g., deposited over the entirety of the substrate), including over the logic gate structure 64 in logic region 12 and over the split gate structure 68 in NVM region 14. ILD layer 50 may be deposited using CVD, PECVD, PVD, or ALD to a predetermined thickness (e.g., approximately 500-5000 Angstroms) that is at least as thick as the height of the select gate structure 66. As deposited, the ILD layer 50 can be formed alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). As will be appreciated, the ILD layer 50 may be densified with one or more anneal process steps, though it will be appreciated that an anneal process may also be applied subsequently in the fabrication process.

Figure 8:
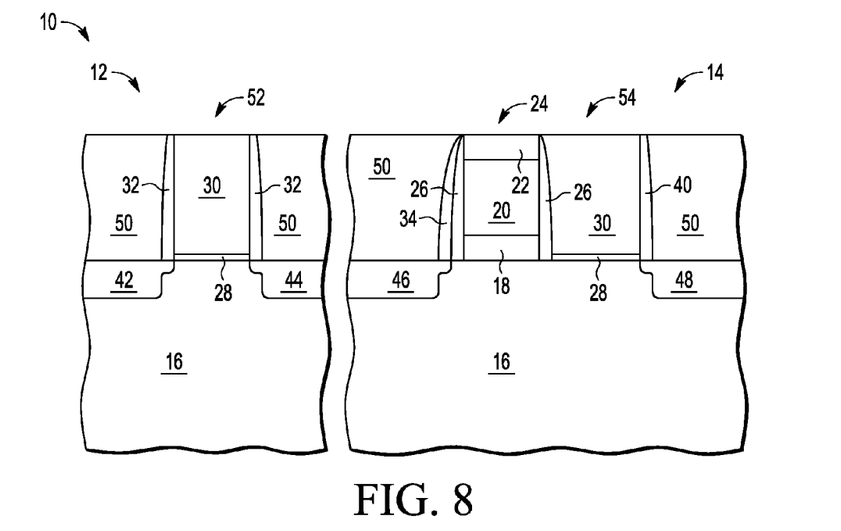

FIG. 8 illustrates processing of semiconductor structure 10 subsequent to FIG. 7. ILD layer 50 is planarized using any desired planarization process, such as a timed chemical mechanical polishing (CMP) step, to form a substantially planar surface on ILD layer 50. Planarization forms a dummy logic gate 52 (which is the remaining portion of logic gate structure 64 that includes the first remaining portion of poly layer 30, or dummy gate material) and a dummy select gate 54 (which is the remaining portion of the select gate structure 66 that includes the second remaining portion of poly layer 30, or dummy gate material). Planarization also exposes a top surface of the first remaining portion of poly layer 30 of dummy logic gate 52 in logic region 12 (also referred to as a top surface of dummy logic gate) and a top surface of the second remaining portion of poly layer 30 of dummy select gate 54 in NVM region 14 (also referred to as a top surface of dummy select gate). After planarization, at least a portion of capping layer 22 continues to remain over poly layer 20, which protects control gate stack 24 and provides isolation between control gate stack 24 and the resulting select gate. In the embodiments discussed below, the top surface of poly layer 20 of control gate stack 24 is lower relative to the top surface of the dummy select gate, and may also be lower relative to the top surface of the dummy logic gate, after planarization.

In some embodiments, capping layer 22 is used as a planarization stop to ensure that planarization does not reach poly layer 20. In such embodiments, planarization reaches capping layer 22 before stopping, which may remove a small portion of capping layer 22. In such embodiments, planarization exposes a top surface of the control gate stack 24 (e.g., the top surface of remaining capping layer 22) that is coplanar with the top surface of the dummy select gate, and may also be coplanar with the top surface of the dummy logic gate.

In other embodiments, planarization does not reach capping layer 22, such as when planarization is timed to stop before reaching capping layer 22. In such embodiments, the portion of capping layer 22 remains in its entirety over poly layer 20, with a portion of ILD layer 50 also remaining over capping layer 22. In such embodiments, a portion of sidewall 36 and poly layer 30 may also remain over capping layer 22, where poly layer 30 of the dummy select gate extends over a portion of control gate stack 24. In such embodiments, planarization does not expose a top surface of the control gate stack 24 (e.g., the top surface of capping layer 22), but instead exposes a top surface of the remaining portion of ILD layer 50 that is located above the top surface of the control gate stack. In such embodiments, the top surface of the control gate stack is lower relative to the top surface of the dummy select gate, and may also be lower relative to the top surface of the dummy logic gate, after planarization. Since capping layer 22 is in its entirety, capping layer 22 (and the remaining portion of ILD layer 50) provides improved isolation between the control gate and the resulting select gate, as compared with a (smaller) remaining portion of capping layer 22.

Figure 9:
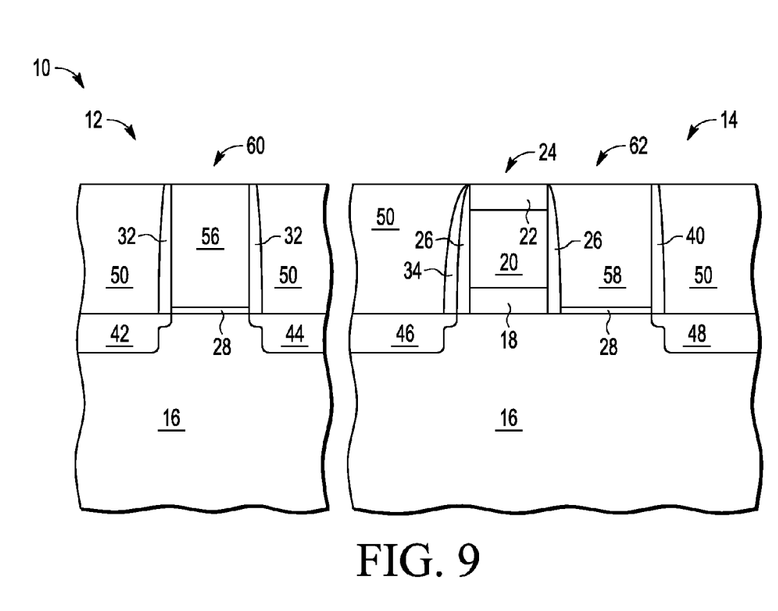

FIG. 9 illustrates processing of semiconductor structure 10 subsequent to FIG. 8. A replacement gate method (also referred to as a metal gate-last process) is used to replace dummy logic gate 52 with metal logic gate 60 and to replace dummy select gate 54 with metal select gate 62. In such a replacement method, at least a portion of dummy logic gate 52 is removed by applying one or more etch processes. For example, a first poly etch process is applied to remove the exposed poly layer 30 (or dummy gate material) from the dummy logic gate 52 and from the dummy select gate 54, where the poly layer 30 is etched selective to the material(s) used to form the ILD layer 50 (e.g., silicon oxide), the capping layer 22 (e.g., silicon nitride), and the sidewall spacers (e.g., silicon dioxide or nitride). Removal of the exposed portions of poly layer 30 may use any desired poly etch process, including a dry etching process such as reactive-ion etching, ion beam etching, plasma etching, or laser etching, a wet etching process using a chemical etchant, or any combination thereof.

Once the exposed portions of poly layer 30 are removed, the resulting openings in the dummy logic gate 52 and the dummy select gate 54 expose portions of the previously formed gate dielectric layer 28. In some embodiments, the exposed portions of gate dielectric layer 28 are replaced with one or more appropriate gate dielectric layers. In such replacement embodiments, at least a portion of the gate dielectric layer 28 is removed by applying one or more appropriate dielectric etch processes to expose the underlying substrate 16 in each opening. For example, gate dielectric layer 28 may include a thermal oxide layer that is etched selective to the material(s) used to form the ILD layer 50, the capping layer 22, and the sidewall spacers. Removal of the exposed portions of gate dielectric layer 28 may use any desired dielectric etch process, including a dry etching process such as reactive-ion etching, ion beam etching, plasma etching, or laser etching, a wet etching process using a chemical etchant, or any combination thereof. In selected embodiments, a wet etching process is applied briefly to remove the gate dielectric layer 28, where the timing and chemistry of the wet etch is controlled to minimize any etching of the planarized ILD layer 50 and sidewall spacers.

A high-k dielectric layer (not shown) is then formed to a predetermined gate dielectric thickness in each opening over the substrate 16. The high-k dielectric layer may be formed alone or in combination with a barrier layer, which is a layer of barrier metal that is deposited over the high-k dielectric layer in each opening to a predetermined thickness (e.g., approximately 50-200 Angstroms, although thinner or thicker layers may be used). In selected embodiments, the high-k dielectric layer may be formed by depositing a high-k gate dielectric material with a relatively high dielectric constant value over the substrate 16 in each opening using CVD, PECVD, PVD, ALD, or any combination(s) of the above. In selected embodiments, the high-k dielectric layer may be formed by a low temperature CVD or ALD process to a predetermined final thickness in the range of 1-100 Angstroms (e.g., 15-25 Angstroms), though other thicknesses may be used. A suitable high-k gate dielectric material for the high-k dielectric layer is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. A suitable temperature for the deposition process is in the range of approximately 200 degrees Celsius to approximately 400 degrees Celsius. Any portion of the high-k dielectric layer and barrier layer (if present) that is formed outside of each opening is removed.

In other embodiments, one or more appropriate gate dielectric layers are formed over the exposed portions of gate dielectric layer 28 in each opening. For example, the gate dielectric layer 28 may include a thermal oxide layer, where a high-k dielectric layer is formed over gate dielectric layer 28 in each opening. The high-k dielectric layer may be formed alone or in combination with a barrier layer, which is formed over the high-k dielectric layer in each opening. Any portion of the high-k dielectric layer and barrier layer (if present) that is formed outside of each opening is removed.

In still other embodiments, the exposed portions of gate dielectric layer 28 already include one or more appropriate gate dielectric layers in each opening. For example, gate dielectric layer 28 may include a high-k dielectric layer, alone or in combination with a barrier layer formed over the high-k dielectric layer.

A metal gate stack (also referred to as a conductive gate) is then formed over the one or more appropriate gate dielectric layers in each opening, where a high-k metal gate (HKMG) stack is formed in the event the one or more appropriate gate dielectric layers include a high-k dielectric layer. In the embodiment illustrated in FIG. 9, metal gate stack 56 is formed in the opening of the logic gate (replacing the first remaining portion of the poly layer 30) and results in a metal logic gate 60. Metal gate stack 58 is formed in the opening of the select gate (replacing the second remaining portion of the poly layer 30) and results in a metal select gate 62. Metal gate stack 56 and metal gate stack 58 each include one or more metal layers. In some embodiments, the metal gate stack used in the logic gate 60 is identical to the metal gate stack used in the select gate 62 (e.g., stacks 56 and 58 include the same metal layers). In other embodiments, the metal gate stack used in the logic gate 60 is different from the metal gate stack used in the select gate 62 (e.g., stacks 56 and 58 include different metal layers).

It is noted that the portion of capping layer 22 that remains over poly layer 20 provides isolation between control gate stack 24 and the metal gate stack 58. Isolation may be improved by leaving capping layer 22 in its entirety over the control gate stack (e.g., by stopping planarization in FIG. 8 before reaching capping layer 22, which may also leave a remaining portion of ILD layer 50 over the control gate stack). It is also noted that in some embodiments where a portion of ILD layer 50 and a portion of poly layer 30 remain over control gate stack 24, the resulting metal gate stack 58 may extend over a portion of the control gate stack 24 (due to poly layer 30 being replaced with metal).

Each metal gate stack is formed using any desired technique, such as by conformally depositing one or more metal layers on the bottom of the openings, depending on the type of transistor (e.g., NMOS or PMOS) being formed, or other desired deposition or sputtering process, such as CVD, PECVD, PVD, ALD, molecular beam deposition (MBD), or any combination(s) thereof. A suitable material for use as a metal layer is a conductive material, such as a metal or transition metal material including, as an example, aluminum, tungsten, titanium or TiN, using metal organic chemical vapor deposition (MOCVD), CVD, PECVD, PVD, ALD, MBD, or any combination(s) thereof to a predetermined thickness in the range of 200-1000 Angstroms (e.g., 500-600 Angstroms), though other materials and thicknesses may be used. In selected embodiments, the one or more metal layers may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as IrO2), which may be deposited to a predetermined thickness of 20-150 Angstroms, although other metallic layer materials with different thicknesses may be used. As will be appreciated, the one or more metal layers may be used to adjust the work function of the finally formed transistor, depending on its polarity type. If desired, an upper portion of the metal gate stacks may be removed in order to planarize the metal gate stacks with the planarized portions of ILD layer 50 by applying a chemical mechanical polish to clear any metal over the top of the planarized portion of ILD layer 50, though this polish step can occur later in the fabrication sequence.

After the metal gate stacks are formed (and planarized, if desired), the top surface of poly layer 20 of control gate stack 24 is lower relative to the top surface of the resulting metal select gate 62, and may also be lower relative to the top surface of the resulting metal logic gate 60. In some embodiments, the top surface of the control gate stack 24 (e.g., the top surface of capping layer 22) may be coplanar with the top surface of metal select gate 62, and may also be coplanar with the top surface of metal logic gate 60. In other embodiments, the top surface of the control gate stack 24 (e.g., the top surface of capping layer 22) is lower relative to the top surface of metal select gate 62, and may also be lower relative to the top surface of metal logic gate 60 (e.g., the top surface of capping layer 22 is covered by a remaining portion of ILD layer 50, which has a top surface that is coplanar with the top surface of metal select gate 62, and may also be coplanar with the top surface of metal logic gate 60).

As will be appreciated, additional processing steps may be used to complete the fabrication of the split-gate non-volatile memory cells and other transistors in the NVM and logic regions. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

By now it should be appreciated that there has been provided embodiments of semiconductor structures and methods for making semiconductor structures that disclose an integrated fabrication process for producing a split gate non-volatile memory (NVM) cell including a non-metal control gate and a metal select gate. One embodiment of the present disclosure provides for a method of making a semiconductor structure using a semiconductor substrate, where the semiconductor structure includes a split gate NVM cell in an NVM region of the substrate. The method includes forming a charge storage layer on the substrate, depositing a first conductive layer over the charge storage layer, depositing a capping layer over the first conductive layer, and patterning the capping layer, the first conductive layer, and the charge storage layer to form a control gate stack. The method also includes depositing a second conductive layer over the substrate including over the control gate stack; and patterning the second conductive layer to leave a first portion of the second conductive layer over a portion of the control gate stack and adjacent to a first side of the control gate stack. The method also includes planarizing the first portion of the second conductive layer and the control gate stack to leave a dummy select gate from the first portion of the second conductive layer, where the planarizing exposes a top surface of the dummy select gate, and a top surface of a remaining portion of the first conductive layer of the control gate stack is lower relative to the top surface of the dummy select gate; and replacing the dummy select gate with a select gate including metal.

One aspect of the above embodiment further provides that the method further includes forming an insulating sidewall spacer on sides of the control gate stack prior to the depositing the second conductive layer. A further aspect of the above embodiment provides that the method further includes forming a first dielectric layer on the substrate after the patterning the capping layer, the first conductive layer, and the charge storage layer and prior to the depositing the second conductive layer. A still further aspect provides that the first dielectric layer includes one of a group consisting of thermal oxide and a high-k dielectric.

Another further aspect provides that the patterning the second conductive layer further includes etching the first dielectric layer to leave a portion of the first dielectric layer under the first portion of the second conductive layer. In a still further aspect, the method further includes replacing the portion of the first dielectric layer with a high-k dielectric prior to replacing the dummy select gate.

Another aspect of the above embodiment further provides that the semiconductor structure further includes a logic transistor in a logic region, and the method further includes removing the capping layer, the first conductive layer, and the charge storage layer from the logic region prior to depositing the second conductive layer. A further aspect provides that the patterning the second conductive layer is further characterized by leaving a dummy logic gate in the logic region. A still further aspect provides that the method further includes replacing the dummy logic gate with a logic gate including metal.

Another further aspect provides that the method further includes forming a first dielectric layer on the substrate in the NVM region and the logic region after the patterning the capping layer, the first conductive layer, and the charge storage layer and prior to the depositing the second conductive layer, wherein the first dielectric layer includes one of a group consisting of oxide and a high-k dielectric. In another further aspect, the method further includes forming a first dielectric layer on the substrate in the NVM region and the logic region after the patterning the capping layer, the first conductive layer, and the charge storage layer and prior to the depositing the second conductive layer, wherein the patterning the second conductive layer further includes etching the first dielectric layer to leave a portion of the first dielectric layer under the dummy logic gate. A still further aspect provides that the method further includes replacing the first dielectric layer with a high-k dielectric prior to replacing the dummy logic gate.

Another embodiment of the present disclosure provides for a semiconductor structure using a substrate having a non-volatile memory (NVM) region that includes a split gate NVM cell. The split gate NVM cell includes a control gate stack that includes a charge storage layer over the substrate, a polysilicon control gate over the charge storage layer, and a capping layer of dielectric material over the polysilicon control gate, where the capping layer has a top surface of the control gate stack; and a select gate stack laterally adjacent to the control gate stack having a gate dielectric over the substrate and a conductive select gate over the gate dielectric, where the polysilicon control gate has a top surface that is lower relative to a top surface of the conductive select gate.

One aspect of the above embodiment provides that the semiconductor structure further includes a first source/drain in the substrate adjacent to a first side of the control gate stack and a second source/drain in the substrate adjacent to a first side of the select gate stack, wherein the first side of the control gate stack is on an opposite side of the split gate NVM cell from the first side of the select gate stack.

Another aspect of the above embodiment further provides that the conductive select gate includes metal and the gate dielectric includes a high-k dielectric material. A further aspect provides that the select gate further includes a polysilicon layer having a top surface of the conductive select gate.

Another aspect of the above embodiment further provides that the semiconductor structure further includes a logic region, which includes a logic transistor in the logic region, where the logic transistor has a gate including metal with a top surface coplanar with the top surface of conductive select gate. A further aspect provides that the gate of the logic transistor has a top layer of polysilicon over a metal layer, where the top layer of polysilicon has a top surface as the top surface of the gate of the logic transistor.

Another embodiment of the present disclosure provides for a method of making a semiconductor structure using a substrate, wherein the semiconductor structure includes a split gate non-volatile memory (NVM) structure in an NVM region. The method includes forming a charge storage layer on the substrate; depositing a first polysilicon layer over the charge storage layer; depositing a capping layer over the first polysilicon layer; and patterning the capping layer, the first conductive layer, and the charge storage layer to leave a control gate stack that includes remaining portions of the capping layer, the first conductive layer, and the charge storage layer. The method further includes depositing a second polysilicon layer over the substrate including over the control gate stack; and patterning the second polysilicon layer to leave a first portion of the second polysilicon layer over a portion of the control gate stack and adjacent to a first side of the control gate stack. The method further includes planarizing the first portion of the second polysilicon layer and the control gate stack to leave a dummy select gate from the first portion of the second polysilicon layer, where a top surface of the control gate stack includes a top surface of the remaining portion of the capping layer and where a top surface of the remaining portion of the first conductive layer is lower relative to a top surface of the dummy select gate; and replacing the dummy select gate with a select gate that includes metal by using an etchant to remove the dummy select gate, where the etchant is highly selective to polysilicon and does not substantially remove the capping layer.

One aspect of the above embodiment provides that the semiconductor structure further includes a logic transistor in a logic region, the method further includes removing the capping layer, the first conductive layer, and the charge storage layer from the logic region prior to depositing the second conductive layer; where: the depositing the second polysilicon layer deposits the second polysilicon layer over the logic region; the patterning the second polysilicon layer leaves a dummy logic gate including polysilicon over the substrate in the logic region; the planarizing the first portion of second polysilicon layer leaves the dummy gate with a top surface coplanar with a top surface of the dummy select gate and a top surface of the control gate stack; and the replacing the dummy select gate occurs simultaneously with replacing the dummy logic gate with a gate including metal.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, gate dielectric layer 28 that is a thermal oxide layer can be deposited over the control gate stack 24 without needing to be removed from the control gate stack's outer sidewall spacer. In addition, it will be appreciated that other types of split-gate NVM bitcell devices may be formed with different sequencing and/or materials. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate, wherein the semiconductor structure comprises a split gate non-volatile memory (NVM) cell in an NVM region, the method comprising:
- forming a charge storage layer on the substrate;
- depositing a first conductive layer over the charge storage layer;
- depositing a capping layer over the first conductive layer;
- patterning the capping layer, the first conductive layer, and the charge storage layer to form a control gate stack;
- depositing a second conductive layer over the substrate including over the control gate stack;
- patterning the second conductive layer to leave a first portion of the second conductive layer over a portion of the control gate stack and adjacent to a first side of the control gate stack;
- planarizing the first portion of the second conductive layer and the control gate stack to leave a dummy select gate from the first portion of the second conductive layer, wherein
  - the planarizing exposes a top surface of the dummy select gate, and
  - a top surface of a remaining portion of the first conductive layer of the control gate stack is lower relative to the top surface of the dummy select gate; and
- replacing the dummy select gate with a select gate comprising metal, wherein the method further comprising replacing a portion of a first dielectric layer with a high-k dielectric prior to replacing the dummy select gate.

2. The method of claim 1, further comprising:
forming an insulating sidewall spacer on sides of the control gate stack prior to the depositing the second conductive layer.

3. The method of claim 2, further comprising:
forming the first dielectric layer on the substrate after the patterning the capping layer, the first conductive layer, and the charge storage layer and prior to the depositing the second conductive layer.

4. The method of claim 3, wherein the first dielectric layer comprises one of a group consisting of thermal oxide and a high-k dielectric.

5. The method of claim 3, wherein the patterning the second conductive layer further comprises etching the first dielectric layer to leave the portion of the first dielectric layer under the first portion of the second conductive layer.

6. The method of claim 1, wherein the semiconductor structure further comprises a logic transistor in a logic region, further comprising:
removing the capping layer, the first conductive layer, and the charge storage layer from the logic region prior to depositing the second conductive layer.

7. The method of claim 6, wherein the patterning the second conductive layer is further characterized by leaving a dummy logic gate in the logic region.

8. The method of claim 7, further comprising replacing the dummy logic gate with a logic gate comprising metal.

9. The method of claim 8, further comprising forming a first dielectric layer on the substrate in the NVM region and the logic region after the patterning the capping layer, the first conductive layer, and the charge storage layer and prior to the depositing the second conductive layer, wherein the first dielectric layer comprises one of a group consisting of oxide and a high-k dielectric.

10. The method of claim 8 further comprising forming a first dielectric layer on the substrate in the NVM region and the logic region after the patterning the capping layer, the first conductive layer, and the charge storage layer and prior to the depositing the second conductive layer, wherein the patterning the second conductive layer further comprises etching the first dielectric layer to leave a portion of the first dielectric layer under the dummy logic gate.

11. The method of claim 10, further comprising replacing the first dielectric layer with a high-k dielectric prior to replacing the dummy logic gate.

12. A method of making a semiconductor structure using a substrate, wherein the semiconductor structure comprises a split gate non-volatile memory (NVM) structure in an NVM region, the method comprising:
- forming a charge storage layer on the substrate;
- depositing a first polysilicon layer over the charge storage layer;
- depositing a capping layer over the first polysilicon layer;
- patterning the capping layer, the first conductive layer, and the charge storage layer to leave a control gate stack comprising remaining portions of the capping layer, the first conductive layer, and the charge storage layer;
- depositing a second polysilicon layer over the substrate including over the control gate stack;
- patterning the second polysilicon layer to leave a first portion of the second polysilicon layer over a portion of the control gate stack and adjacent to a first side of the control gate stack;
- planarizing the first portion of the second polysilicon layer and the control gate stack to leave a dummy select gate from the first portion of the second polysilicon layer, wherein a top surface of the control gate stack comprises a top surface of the remaining portion of the capping layer and wherein a top surface of the remaining portion of the first conductive layer is lower relative to a top surface of the dummy select gate; and
- replacing the dummy select gate with a select gate comprising metal by using an etchant to remove the dummy select gate, wherein the etchant is highly selective to polysilicon and does not substantially remove the capping layer.

13. The method of claim 12, wherein the semiconductor structure further comprises a logic transistor in a logic region, further comprising:
removing the capping layer, the first conductive layer, and the charge storage layer from the logic region prior to depositing the second conductive layer;
wherein:
- the depositing the second polysilicon layer deposits the second polysilicon layer over the logic region;
- the patterning the second polysilicon layer leaves a dummy logic gate comprising polysilicon over the substrate in the logic region;
- the planarizing the first portion of second polysilicon layer leaves the dummy logic gate with a top surface coplanar with a top surface of the dummy select gate; and
- the replacing the dummy select gate occurs simultaneously with replacing the dummy logic gate with a gate comprising metal.

* * * * *